United States Patent
Kawai et al.

(10) Patent No.: US 7,973,822 B2
(45) Date of Patent: Jul. 5, 2011

(54) DRIVE DEVICE AND IMAGE STABILIZER

(75) Inventors: Sumio Kawai, Hachioji (JP); Takashi Okamura, Kokubunji (JP)

(73) Assignee: Olympus Imaging Corp., Tokyo (JP)

( * ) Notice: Subject to any disclaimer, the term of this patent is extended or adjusted under 35 U.S.C. 154(b) by 599 days.

(21) Appl. No.: 12/146,156

(22) Filed: Jun. 25, 2008

(65) Prior Publication Data

US 2009/0002500 A1    Jan. 1, 2009

(30) Foreign Application Priority Data

Jun. 28, 2007    (JP) ................. 2007-171058

(51) Int. Cl.
*H04N 5/228* (2006.01)
*H04N 5/225* (2006.01)

(52) U.S. Cl. ........... 348/208.7; 348/208.2; 348/374; 396/55; 310/323.02

(58) Field of Classification Search ........... 348/208.2, 348/208.4, 208.7
See application file for complete search history.

(56) References Cited

U.S. PATENT DOCUMENTS

| | | | |
|---|---|---|---|
| 7,129,621 B2 | 10/2006 | Sakano et al. | |
| 7,268,464 B2 * | 9/2007 | Kishi | 310/323.02 |
| 7,432,635 B2 * | 10/2008 | Kawai | 310/323.17 |
| 7,466,062 B2 * | 12/2008 | Sakatani et al. | 310/323.16 |
| 7,521,839 B2 * | 4/2009 | Mori | 310/323.02 |
| 7,778,536 B2 * | 8/2010 | Okamura | 396/55 |
| 7,817,908 B2 * | 10/2010 | Kawai | 396/55 |
| 7,834,517 B2 * | 11/2010 | Sakamoto | 310/323.02 |
| 7,884,528 B2 * | 2/2011 | Sakano | 310/323.02 |
| 7,893,598 B2 * | 2/2011 | Kawai et al. | 310/323.02 |
| 2009/0268042 A1 * | 10/2009 | Kawai | 348/208.7 |

FOREIGN PATENT DOCUMENTS

JP    2006-067712    3/2006
JP    2006-81348    3/2006

* cited by examiner

*Primary Examiner* — Ngoc-Yen T Vu
(74) *Attorney, Agent, or Firm* — Volpe and Koenig, P.C.

(57) ABSTRACT

A drive device includes an actuator, a fixed member, a movable member, rotating members, and a guide member. The actuator is arranged on the fixed member, and includes a piezoelectric element and at least two drivers on the piezoelectric element in parallel with the central axis of the piezoelectric element. The movable member moves by the drivers on the fixed member. The rotating members are located between the fixed member and the movable member to support the movable member. The guide member is arranged on at least one of the fixed member and the movable member, and guides movement of the rotating members in a direction parallel to the central axis of the piezoelectric element. The drivers are located between the rotating members in the direction parallel to the central axis of the piezoelectric element.

9 Claims, 9 Drawing Sheets

DRIVE DEVICE AND IMAGE STABILIZER

CROSS-REFERENCE TO RELATED APPLICATIONS

This application is based upon and claims the benefit of priority from Japanese Patent Application No. 2007-171058, filed Jun. 28, 2007, the entire contents of which are incorporated herein by reference.

BACKGROUND OF THE INVENTION

1. Field of the Invention

The present invention relates to a drive device that drives a movable member by an actuator to move the movable member in a predetermined direction, and an image stabilizer that corrects for shake on a hand-held shot with an imaging apparatus.

2. Description of the Related Art

Conventional imaging apparatuses such as digital cameras are often provided with an image stabilizer to stabilize handshake blurring. Japanese Patent Application Laid-open Nos. 2006-81348 and 2006-67712 each disclose an example of an image stabilizer. The image stabilizer shifts, by a vibrator including an actuator, an imaging device such as a charge-coupled device (CCD) in a plane perpendicular to the imaging optical axis in the horizontal and vertical directions independently of each other. Thus, the image stabilizer corrects the position on the imaging surface of the imaging device where light rays reflected from an object are focused. To move a movable member having the imaging device mounted thereon by the vibrator such as an actuator as described above, a ball support system is known as a conventional technology in which the movable member is movably supported by a plurality of balls arranged sequentially along the movement path.

SUMMARY OF THE INVENTION

A drive device according to one aspect of the present invention includes an actuator including a piezoelectric element having as a whole an elongated shape and at least two drivers that are arranged on the piezoelectric element along an axis parallel to a central axis of the piezoelectric element; a fixed member on which the actuator is arranged; a movable member that moves by the drivers on the fixed member; two rotating members that are located between the fixed member and the movable member to support the movable member that moves on the fixed member; and a guide member that is arranged on at least one of the fixed member and the movable member, and guides movement of the rotating members in a direction parallel to the central axis of the piezoelectric element. A positional relation between the drivers and the rotating members is defined such that the drivers are located between the rotating members in the direction parallel to the central axis of the piezoelectric element even when the movable member moves to the maximum extent on the fixed member.

An image stabilizer according to another aspect of the present invention is for correcting a position on a surface of a rectangular imaging device where light rays reflected from an object are focused. The image stabilizer includes a first actuator that includes a piezoelectric element having as a whole an elongated shape and at least two first drivers that are arranged on the piezoelectric element along an axis parallel to a central axis of the piezoelectric element, and arranged in parallel with a direction of a first side of the imaging device; a fixed member that includes the first actuator; a second actuator that includes a piezoelectric element having as a whole an elongated shape and at least two second drivers that are arranged on the piezoelectric element along an axis parallel to a central axis of the piezoelectric element, and arranged in parallel with a direction of a second side of the imaging device perpendicular to the first side; a first movable member that includes the second actuator, and moves, when driven by the first actuator, in the direction of the first side on the fixed member; a second movable member that is mounted with the imaging device, and moves, when driven by the second actuator, in the direction of the second side on the first movable member; two first rotating members that are located between the fixed member and the first movable member to support the first movable member that moves on the fixed member; and two second rotating members that are located between the first movable member and the second movable member to support the second movable member that moves on the first movable member. The first drivers are located between the first rotating members during operation to move the first movable member. The second drivers are located between the second rotating members during operation to move the second movable member.

A drive device according to still another aspect of the present invention includes a vibrator that, when applied with a predetermined frequency voltage, causes elliptical vibration having a different phase in each of two driving members; a fixed member that includes a holding member for holding the vibrator; a pressing mechanism that presses the driving members of the vibrator arranged on the fixed member; and a movable member that is driven by the elliptical vibration of the vibrator, moving direction of which is regulated by a guide member of the fixed member. The driving members are in pressure contact with the movable member. The guide member includes two rotating members that are arranged separate from each other; a first groove that is provided on the fixed member; and a second groove that is provided on the movable member such that the rotating members are fitted in between the first groove and the second groove. A spacing between the rotating members is larger than a spacing between the driving members.

A drive device according to still another aspect of the present invention includes a vibrator that, when applied with a predetermined frequency voltage, causes a combination of longitudinal vibration and bending vibration as elliptical vibration having a different phase in each of two driving members; a fixed member that includes a holding member for holding the vibrator; a pressing mechanism that presses the driving members of the vibrator arranged on the fixed member; and a movable member that is driven by the elliptical vibration of the vibrator, moving direction of which is regulated by a guide member of the fixed member. The driving members are in pressure contact with the movable member. The guide member includes two rotating members that are arranged separate from each other; a first groove that is provided on the fixed member; and a second groove that is provided on the movable member such that the rotating members are fitted in between the first groove and the second groove. The rotating members are spaced apart greater than a distance between loops of the bending vibration.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of the present invention are described in detail below with reference to the accompanying drawings. The following embodiments describe a drive device and an image stabilizer for correcting hand-shake in an imaging unit including an imaging device that obtains an image signal by photoelectric conversion. They are herein described as being applied to, for example, a single-lens reflex electronic camera with interchangeable lenses.

Figure 1:
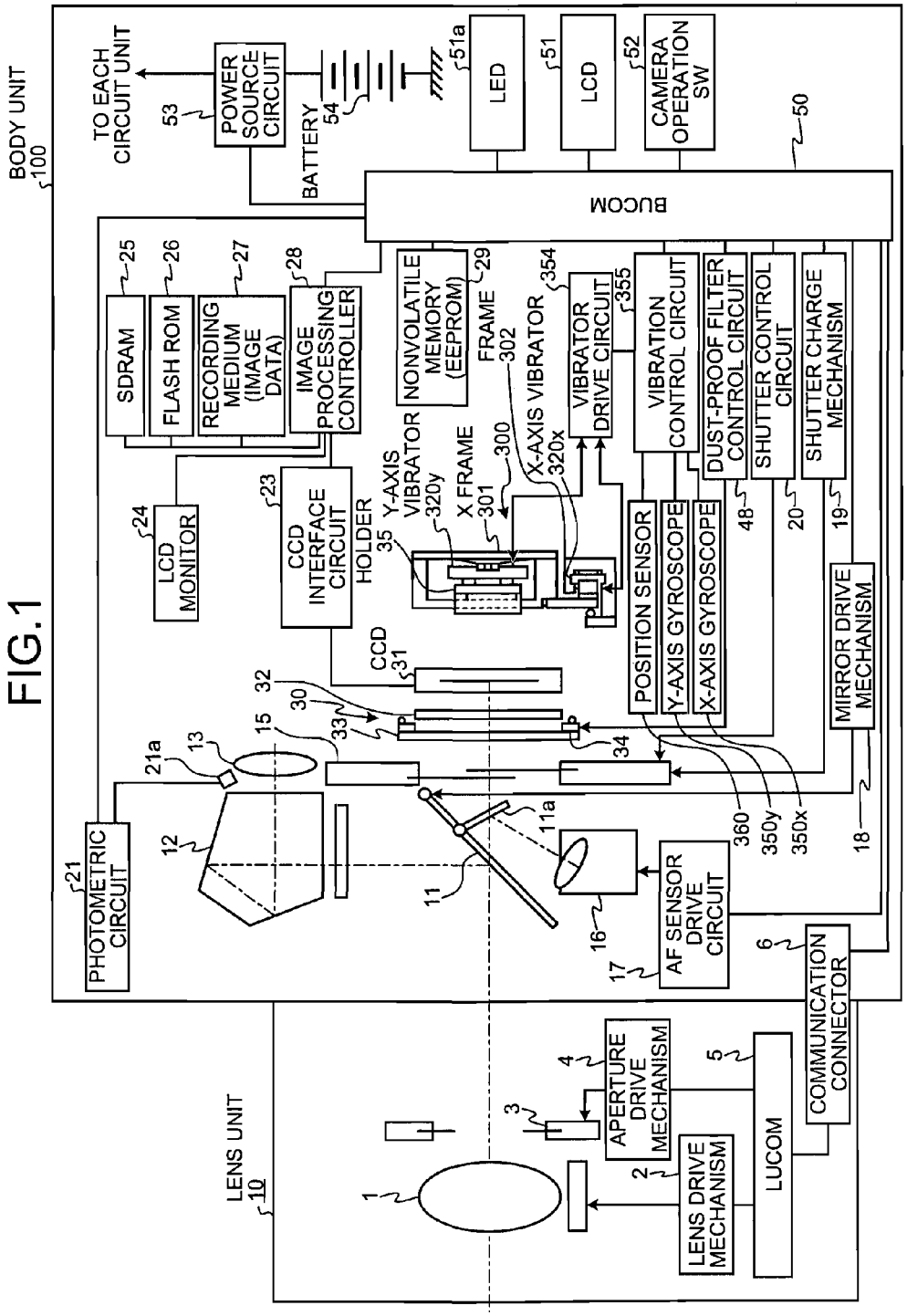
FIG. 1 is a block diagram of an electric system configuration of an electronic camera with an image stabilizer according to an embodiment of the present invention.

A system configuration of an electronic camera with an image stabilizer according to an embodiment of the present invention is described below with reference to FIG. 1. FIG. 1 is a schematic block diagram mainly showing an electrical system configuration of the electronic camera. The system configuration of the electronic camera includes a body unit 100 as the main body, and a lens unit 10 used as an interchangeable lens, which is one of accessories of the camera.

The lens unit 10 is detachably attached to the body unit 100 through a lens mount (not shown) on the front of the body unit 100. The lens unit 10 includes a microcomputer (hereinafter, "Lucom") 5 that controls the lens unit 10. On the other hand, the body unit 100 includes a microcomputer (hereinafter, "Bucom") 50 that controls the body unit 100. While the lens unit 10 is attached to the body unit 100, the Lucom 5 and the Bucom 50 are electrically connected to each other via a communication connector 6 so that they can communicate with each other. The camera system is configured such that the Lucom 5 operates dependently upon and in cooperation with the Bucom 50.

The lens unit 10 further includes an imaging lens 1, a lens drive mechanism 2, an aperture 3, and an aperture drive mechanism 4. The imaging lens 1 is driven by a direct-current (DC) motor (not shown) provided in the lens drive mechanism 2. The aperture 3 is driven by a stepper motor (not shown) provided in the aperture drive mechanism 4. The Lucom 5 controls the motors according to an instruction from the Bucom 50.

As shown in FIG. 1, the body unit 100 is provided therein with single-lens reflex components as an imaging optical system, a focal plane shutter 15 arranged on the imaging optical axis, and an auto-focus (AF) sensor unit 16. The single-lens reflex components constitute an imaging optical system, and include a quick-return mirror 11, a pentaprism 12, an eyepiece 13, and a submirror 11a. The AF sensor unit 16 receives light rays reflected from the submirror 11a, and detects a defocus amount.

The body unit 100 is further provided therein with an AF sensor drive circuit 17, a mirror drive mechanism 18, a shutter charge mechanism 19, a shutter control circuit 20, and a photometric circuit 21. The AF sensor drive circuit 17 controls the drive of the AF sensor unit 16. The mirror drive mechanism 18 controls the drive of the quick-return mirror 11. The shutter charge mechanism 19 charges a spring for driving the front and rear curtains of the shutter 15. The shutter control circuit 20 controls the motion of the front and rear curtains. The photometric circuit 21 performs photometric measurements based on output rays from the pentaprism 12 detected by a photometric sensor 21a.

On the imaging optical axis is arranged an imaging unit 30 that converts light reflected from an object and having passed through the imaging optical system into an electrical signal. The imaging unit 30 includes a charge-coupled device (CCD) 31 as an imaging device, an optical low-pass filter (LPF) 32, and a dust-proof filter 33. The CCD 31 is formed in horizontally a little long rectangle with an aspect ratio of, for example, 4:3. The optical LPF 32 is arranged in front of the CCD 31. On the circumference of the dust-proof filter 33 is provided a piezoelectric element 34. The piezoelectric element 34 has two electrodes. A dust-proof filter control circuit 48 causes the piezoelectric element 34 to vibrate at a predetermined frequency to vibrate the dust-proof filter 33, thereby removing dust from the filter surface. The imaging unit 30 further includes an image stabilizer 300 that corrects for camera shake and includes a drive device, described later.

The camera system further includes a CCD interface circuit 23 connected to the CCD 31 and an image processing control unit 28. The image processing control unit 28 performs image processing using a liquid crystal display (LCD) monitor 24, and as storage areas, a synchronous dynamic random access memory (SDRAM) 25 and a flash read only memory (ROM) 26, and the like. Thus, the camera system is configured to be capable of providing electronic storage/display function as well as electronic imaging function. A recording medium 27 is configured to be communicably connected to the electronic camera via a communication connector and disconnectable therefrom. The recording medium 27 is an external storage medium, examples of which include various types of memory cards and an external hard disk drive (HDD). Image data captured by the electronic camera is stored in the recording medium 27. As another storage area, a nonvolatile memory 29 is provided that is formed of, for example, an electrically erasable programmable read only memory (EEPROM). The nonvolatile memory 29 stores therein predetermined control parameters necessary for camera control, and is accessible from the Bucom 50.

The Bucom 50 is provided with an LCD 51, a light emitting diode (LED) 51a, and a camera operation switch (SW) 52. The LCD 51 and the LED 51a notify a user of the operation state of the electronic camera by the display or output thereof. The camera operation SW 52 is a group of switches including operation buttons necessary for operating the electronic camera. Examples of such operation buttons include a release button, a mode switching button and a power button. The Bucom 50 is further provided with a battery 54 as a power source, a power source circuit 53, and a voltage detector circuit (not shown). The power source circuit 53 converts the voltage of the battery 54 to voltages required to the respective circuit units that constitute the camera system to supply power thereto. The voltage detector circuit detects a voltage change due to a current supplied from an external power source via a plug.

The following is a schematic description of the operation of each component of the camera system configured as above. The image processing control unit 28 controls the CCD interface circuit 23 to acquire image data from the CCD 31 according to an instruction from the Bucom 50. The image data is converted by the image processing control unit 28 into a video signal, and is displayed on the LCD monitor 24. From the display on the LCD monitor 24, the user can check an image captured by the electronic camera.

The configuration of the imaging unit 30 is described in further detail below with reference to FIG. 6. As described above, the imaging unit 30 includes the CCD 31 as an imaging device, the optical LPF 32, the dust-proof filter 33, and the piezoelectric element 34. The dust-proof filter 33 is arranged on the front side of the optical LPF 32 such that they face each other with a predetermined spacing between them. The imaging surface of the CCD 31 is exposed to light that has passed through the imaging optical system. Thus, the CCD 31 obtains an image signal corresponding to the light. The optical LPF 32 is arranged on the imaging surface side of the CCD 31. The optical LPF 32 removes high-frequency components from light reflected from an object and having passed through the imaging optical system. The piezoelectric element 34 is arranged on the circumference of the dust-proof filter 33, and vibrates the dust-proof filter 33 at a predetermined amplitude. By way of example, and not as a limitation, CCD is cited above as the imaging device; however, the imaging device can be a complementary metal oxide semiconductor (CMOS) sensor or the like.

Figure 4:
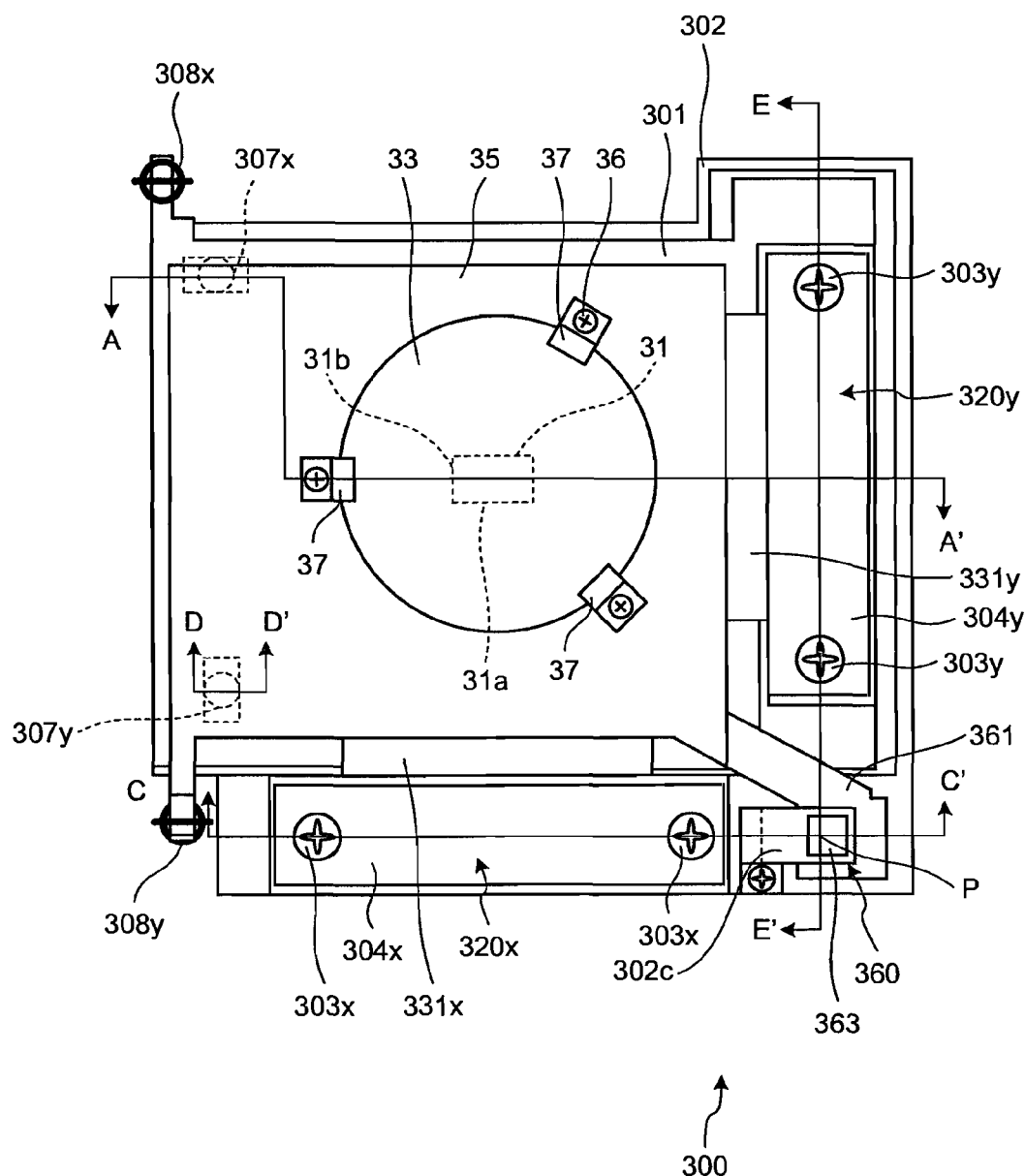
FIG. 4 is a schematic plan view of relevant part of the image stabilizer.

The CCD 31 and the optical LPF 32 are covered in an airtight manner with a holder 35. As shown in FIG. 4, the dust-proof filter 33 as a whole has a plate-like circular (polygonal) shape, and is made of a resilient material such as a plate spring. The dust-proof filter 33 is supported while pressed by pressing members 37 that are fixed to the holder 35 with screws 36.

Described next is the image stabilizer function of the electronic camera according to the embodiment. As used herein, "Z-axis direction" refers to the direction of the imaging optical axis, "X-axis direction" refers to the direction of a first side (longitudinal side) 31a of the rectangle CCD 31 arranged on the imaging optical axis perpendicular thereto, and "Y-axis direction" refers to the direction of a second side (short side) 31b of the CCD 31 perpendicular to the first side 31a (see FIG. 4). The image stabilizer 300 shifts the CCD 31 in either or both the X-axis direction and the Y-axis direction to correct the position on the imaging surface of the CCD 31 where light rays reflected from an object are focused. The image stabilizer 300 uses as a driving source an actuator that causes elliptical vibration in a driving member when applied with a predetermined frequency voltage. The image stabilizer 300 shifts the holder 35 having the CCD 31 mounted thereon in the imaging unit 30.

Figure 2A:
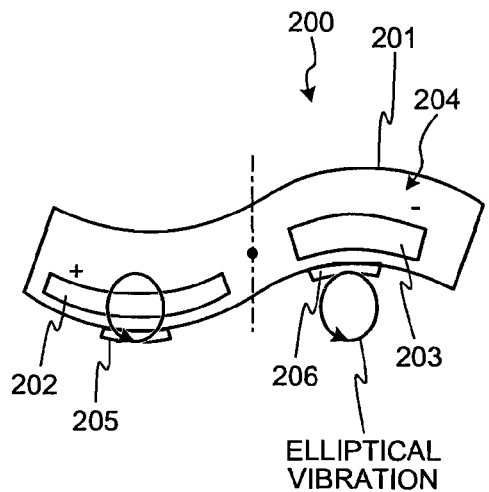
FIG. 2 is a schematic diagram illustrating the operating principle of a vibrator.
Figure 2B:
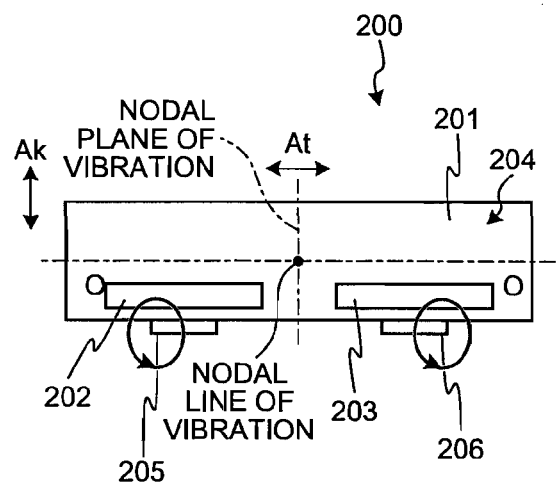
Figure 2C:
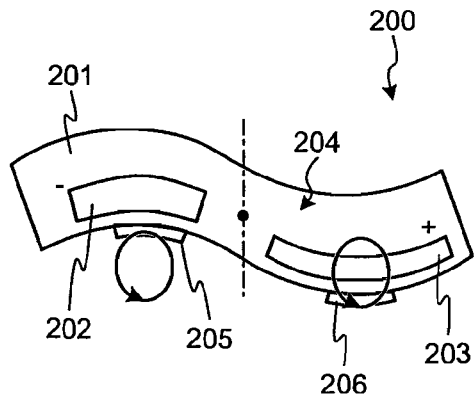

The following is a description with reference to FIG. 2 of the operating principle of a vibrator 200 used as an actuator in the image stabilizer 300. FIG. 2 is a schematic diagram illustrating the operating principle of the vibrator 200. The vibrator 200 includes a piezoelectric body 201, a piezoelectric element 204 formed of a pair of driving electrodes 202 and 203, and two drivers 205 and 206 as driving members. The piezoelectric body 201 has a predetermined size, and has as a whole an elongated, rectangular shape. The driving electrodes 202 and 203 are formed to be symmetrical about the center of the piezoelectric body 201 on one side thereof. The drivers 205 and 206 are arranged along an axis in parallel with the central axis of the piezoelectric element 204 on the surface of the piezoelectric body 201 at positions corresponding to the driving electrodes 202 and 203, respectively. If the vibrator 200 causes only longitudinal vibration so that it expands and contracts in the longitudinal direction, a node of the longitudinal vibration represents s a nodal plane. The nodal plane is a plane of zero amplitude, and the amplitude of the vibration is maximum at the edges of the piezoelectric body 201 in the longitudinal direction. On the other hand, if the vibrator 200 causes only bending vibration, a node of the bending vibration represents s a nodal line (depth direction in FIG. 2). The nodal line with zero amplitude of vibration is present in the nodal plane, and the piezoelectric body 201 rotationally vibrates about the nodal line. The vibrator 200 causes elliptical vibration in the drivers 205 and 206 by a combination of the longitudinal vibration in a direction At (indicated by arrow At in FIG. 2) and the bending vibration in a direction Ak (indicated by arrow Ak) perpendicular to the direction At.

A sinusoidal wave voltage at a predetermined frequency is applied to one of the driving electrodes of the piezoelectric body 201, i.e., the driving electrode 202. At the same time, a sinusoidal wave voltage at the predetermined frequency with a phase shifted from that of the frequency of the sinusoidal wave voltage applied to the driving electrode 202 is applied to the other of the driving electrodes, i.e., the driving electrode 203. The frequency of the sinusoidal wave voltages to be applied is set to a predetermined value such that the center of the piezoelectric body 201 corresponds to the node of the bending vibration, the drivers 205 and 206 correspond to a loop of the bending vibration, and the nodal plane of the longitudinal vibration of the piezoelectric body 201 matches the node of the bending vibration. As a result, along with changes in the polarity, i.e., plus and minus, of the applied voltage, the vibrator 200 repeats the bending vibration and the longitudinal vibration, i.e., states (a) to (c) shown in FIG. 2 including state (b). Thus, the vibrator 200 causes elliptical vibration on the surfaces of the drivers 205 and 206. Accordingly, by arranging a movable body to be driven in such a manner that it is in pressure contact with the drivers 205 and 206 side of the vibrator 200, the movable body moves according to the direction of the elliptical vibration on the surfaces of the drivers 205 and 206.

Figure 3:
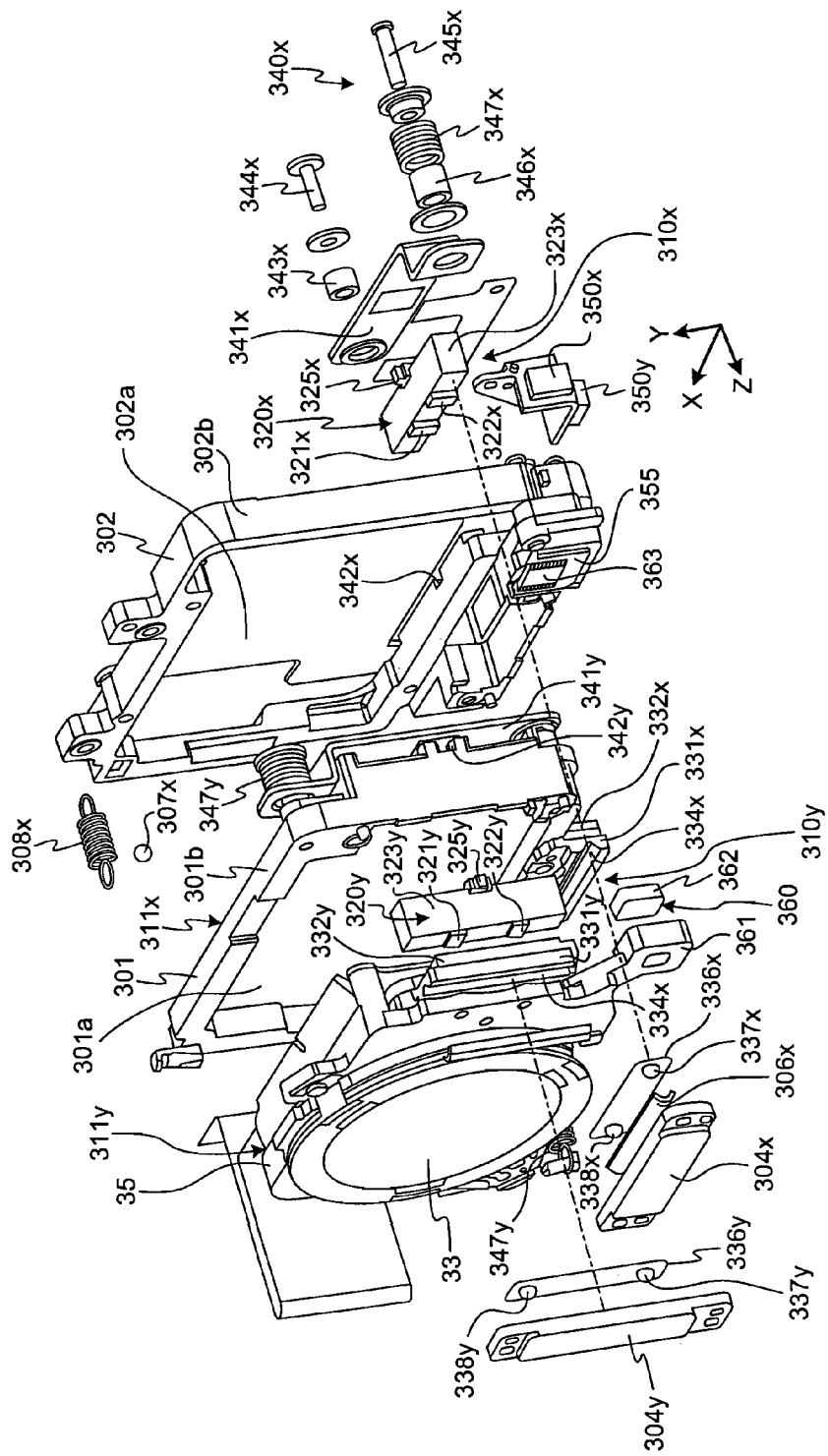
FIG. 3 is an exploded perspective view of the image stabilizer.
Figure 5:
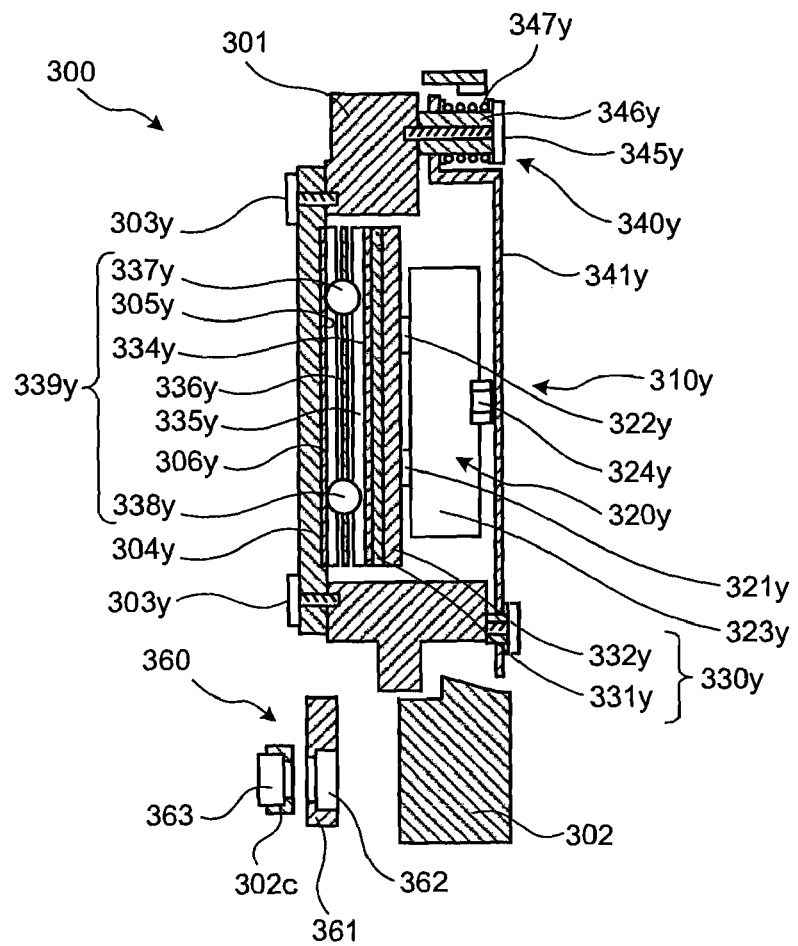
FIG. 5 is a cross section taken along line E-E' of FIG. 4.
Figure 6:
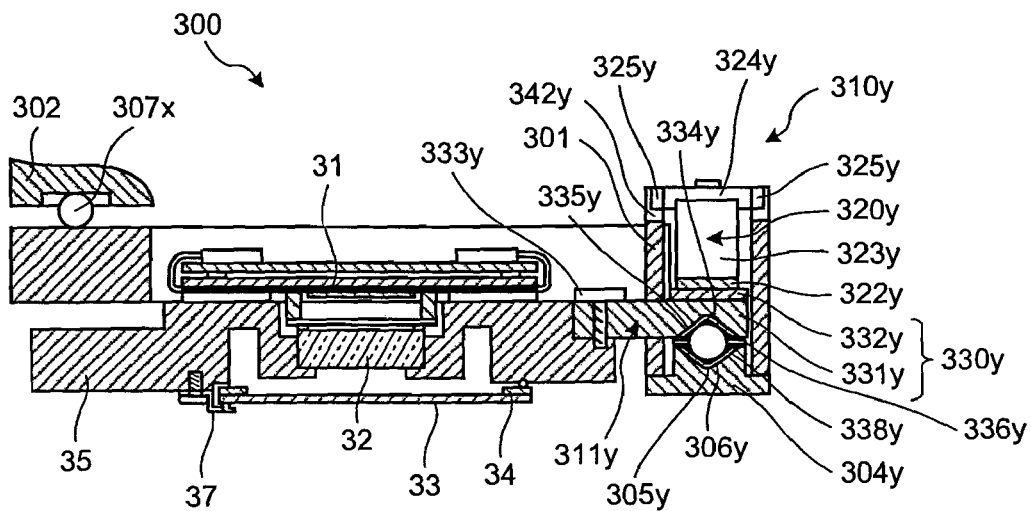
FIG. 6 is a cross section taken along line A-A' of FIG. 4.
Figure 7:
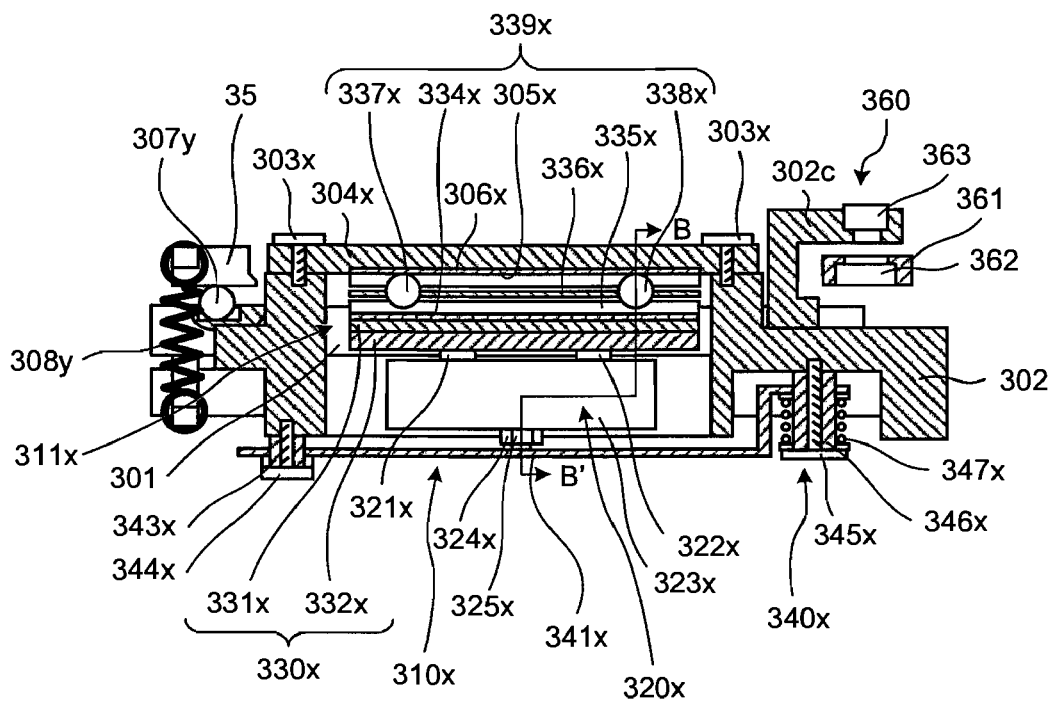
FIG. 7 is a cross section taken along line C-C' of FIG. 4 including a cross section taken along line D-D'.
Figure 8:
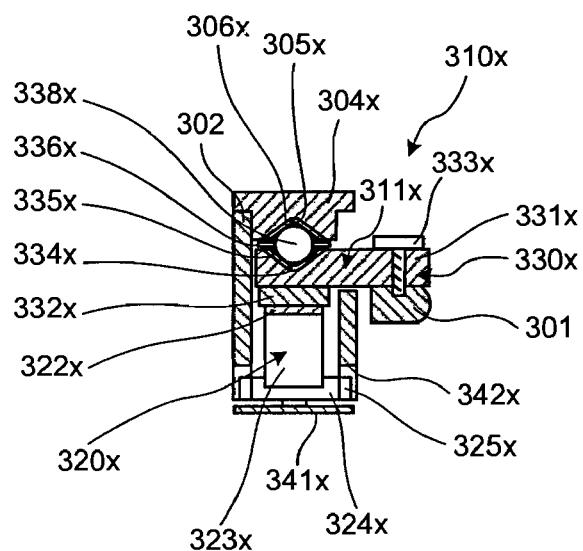
FIG. 8 is a cross section taken along line B-B' of FIG. 7.
Figure 9A:
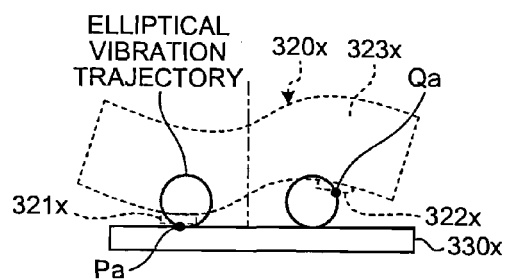
FIG. 9 is a schematic diagram illustrating the driving principle of an X-axis vibrator in chronological order.
Figure 9B:
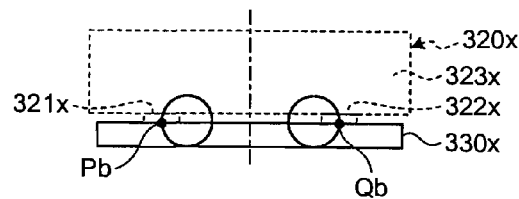
Figure 9C:
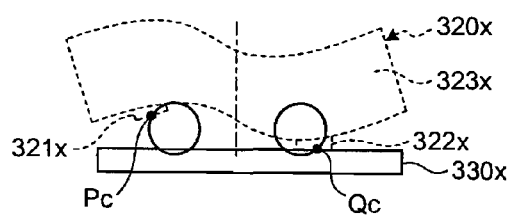
Figure 9D:
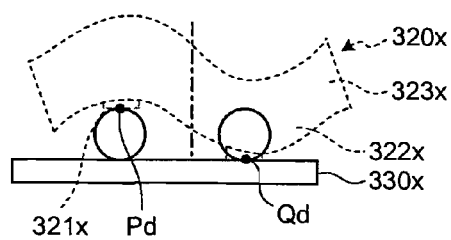
Figure 9E:
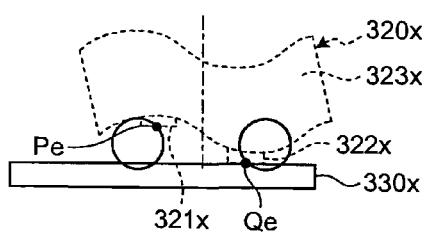
Figure 9F:
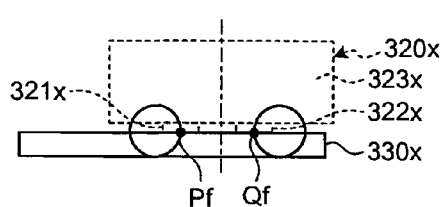
Figure 9G:
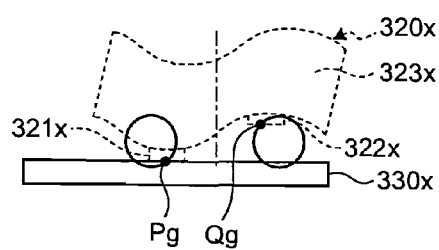
Figure 9H:
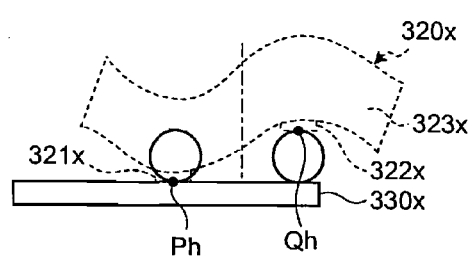

With reference to FIGS. 3 to 8, the image stabilizer 300 is described below that uses the vibrator 200 as an actuator. FIG. 3 is an exploded perspective view of the image stabilizer 300. FIG. 4 is a schematic plan view of relevant part of the image stabilizer 300. FIG. 5 is a cross section taken along line E-E' of FIG. 4. FIG. 6 is a cross section taken along line A-A' of FIG. 4. FIG. 7 is a cross section taken along line C-C' of FIG. 4 including a cross section taken along line D-D'. FIG. 8 is a cross section taken along line B-B' of FIG. 7.

The image stabilizer 300 shifts, as an object to be moved, the holder 35 (movable member, second movable member) having the CCD 31 mounted thereon in either or both the X-axis direction and the Y-axis direction. The image stabilizer 300 includes an X frame 301 and a frame (fixed member) 302. The X frame 301 includes a frame portion 301b that surrounds an opening 301a around the imaging optical axis. The X frame 301 movably supports the holder 35 in the Y-axis direction. The frame 302 includes a frame portion 302b that surrounds an opening 302a around the imaging optical axis. The frame 302 movably supports the X frame 301 in the X-axis direction and is fixed to the camera main body (not shown).

The image stabilizer 300 further includes an X-axis drive mechanism 310x and a Y-axis drive mechanism 310y. The X-axis drive mechanism 310x moves the X frame 301 in the X-axis direction with respect to the frame 302. The Y-axis drive mechanism 310y moves the holder 35 in the Y-axis direction with respect to the X frame 301. With the X-axis drive mechanism 310x and the Y-axis drive mechanism 310y, the image stabilizer 300 shifts the holder 35 together with the X frame 301 in the X-axis direction with respect to the frame 302 as well as shifting the holder 35 in the Y-axis direction with respect to the X frame 301. Thus, The CCD 31 mounted on the holder 35 is shifted in either or both the X-axis direction and the Y-axis direction in the X-Y plane to correct for camera shake.

Described below is the configuration of the X-axis drive mechanism 310x. The X-axis drive mechanism 310x includes an X-axis vibrator (first actuator, vibrator) 320x, a slide member 330x, and a pressing mechanism 340x. The slide member 330x constitutes a first movable member (movable member) 311x that is fixed to the X frame 301 and driven with the X frame 301. The pressing mechanism 340x biases the X-axis vibrator 320x to the side of the slide member 330x.

The X-axis vibrator 320x includes a piezoelectric element 323x has as a whole an elongated, rectangular shape. Following the operating principle of the vibrator 200 previously described in connection with FIG. 2, the X-axis vibrator 320x causes elliptical vibration when applied with a predetermined frequency voltage in drivers 321x and 322x which are arranged on one side of the piezoelectric element 323x. The X-axis vibrator 320x further includes a vibrator holder 324x at the center on the side of the piezoelectric element 323x opposite to the side where the drivers 321x and 322x are arranged. The vibrator holder 324x is provided with a protrusion 325x that is configured to fit in a groove (holding portion) 342x of the frame 302. When the protrusion 325x is fitted in the groove 342x, the X-axis vibrator 320x is positioned and held such that its movement is regulated in the X-axis direction. With this configuration, a driving force due to elliptical vibration that occurs in the drivers 321x and 322x acts along the X-axis direction.

The slide member 330x is formed of a bearing 331x and a slide plate 332x that is fixed to the bearing 331x. The bearing 331x is fixed to a portion of the X frame 301 with, for example, a screw 333x at a position where the drivers 321x and 322x of the X-axis vibrator 320x are pressed into contact with the slide plate 332x. Thus, the bearing 331x is integrated with the X frame 301. As can be seen from FIGS. 7 and 8, the slide member 330x is formed sufficiently smaller than the X frame 301 in a desired size (equivalent in size to the X-axis vibrator 320x). The X frame 301 is made of a material such as low hardness resin or aluminum. On the other hand, the slide plate 332x is made of a material such as high hardness ceramic having wear resistance. The bearing 331x is made of a quenchable material such as ferrite stainless and is quenched to increase the hardness.

The frame 302 includes an attachment portion in a form of opening and a bearing 304x. The bearing 304x is fixed to the attachment portion with a screw 303x to face the bearing 331x of the slide member 330x. As shown in FIG. 8, on the bearing 304x is formed a V-shaped groove (first groove, guide member) 305x along the X-axis direction by fixing thereto a V-shaped groove plate 306x for wear protection. Besides, on the bearing 331x is formed a V-shaped groove (second groove, guide member) 334x by fixing thereto a V-shaped groove plate 335x for wear protection to be opposed to the V-shaped groove 305x (the V-shaped groove plate 306x) on the bearing 304x. Between the V-shaped groove 305x and the V-shaped groove 334x, two balls (first rotating members) 337x and 338x positioned by a retainer 336x are separately arranged along the X-axis direction. The two balls 337x and 338x and the V-shaped grooves 305x and 334x constitute a guide member 339x that regulates the moving direction of the slide member 330x. As shown in FIG. 7, the balls 337x and 338x are positioned separate from each other on the outer side of the drivers 321x and 322x, as described later in further detail. The retainer 336x regulates the movement of the balls 337x and 338x in the X-axis direction.

The pressing mechanism 340x includes a pressing plate 341x and a pressing spring 347x. One edge of the pressing plate 341x is fixed via a spacer 343x to the frame 302 with a screw 344x to support the X-axis vibrator 320x. The other edge of the pressing plate 341x is fixed to the frame 302 with a screw 345x. The pressing spring 347x is arranged around the screw 345x with a spacer 346x therebetween, and biases the pressing plate 341x so that the drivers 321x and 322x of the X-axis vibrator 320x are brought into pressure contact with the slide plate 332x. The pressure exerted by the pressing mechanism 340x is set to a high value of around 15 N (Newton).

The bearing 331x is rotatable around an axis passing through the center of the balls 337x and 338x and in parallel with the V-shaped groove 334x, and is integrated with the X frame 301. Between the X frame 301 and the frame 302 is arranged a ball (second rotating member) 307x in a position separate from the bearing 331x in a direction other than the X-axis direction. The ball 307x is held by a biasing force of a spring 308x engaged between the X frame 301 and the frame 302, and is positioned to maintain a spacing from the X frame 301 to the frame 302 in the imaging optical axis direction (the Z-axis direction). The biasing force of the spring 308x is sufficient if capable of maintaining the ball 307x to be held, and is set to be smaller than that of the pressing spring 347x. With this configuration, the first movable member 311x formed of the X frame 301 and the slide member 330x is movable with respect to the frame 302 based on three-point support by the balls 337x, 338x, and 307x. Besides, the ball 307x is arranged opposite to the balls 337x and 338x with the imaging optical axis and the opening 301a therebetween. Accordingly, the ball 307x can be spaced apart from the balls 337x and 338x, which provides a stable three-point support structure. As described above, according to the embodiment, three balls (rotating members) guides the moving direction of the first movable member 311x as well as regulating the inclination thereof. Thus, stable driving operation can be achieved.

The Y-axis drive mechanism 310y including a Y-axis vibrator (second actuator, vibrator) 320y is of basically the same configuration as the X-axis drive mechanism 310x. Therefore, parts corresponding to those mentioned previously are identified by like reference numerals but with the addition of the suffix "y", and like description is not repeated. Incidentally, the Y-axis drive mechanism 310y includes, in place of the slide member 330x, a slide member 330y that constitutes a second movable member (movable member) 311y, and, instead of the frame 302, the X frame 301 serves as a fixed member. The second movable member 311y is integrally fixed to the holder 35, and is driven together with the holder 35.

The image stabilizer 300 further includes an X-axis gyroscope 350x and a Y-axis gyroscope 350y on the frame 302. The X-axis gyroscope 350x detects camera shake around the X axis of the body unit 100 (in the pitch direction), while the Y-axis gyroscope 350y detects camera shake around the Y axis the body unit 100 (in the yaw direction). The image stabilizer 300 still further includes a position sensor 360, a vibrator drive circuit 354, and a vibration control circuit 355. As shown in FIG. 3, the position sensor 360 includes an arm 361, a magnet 362, and a detecting unit 363. The arm 361 integrally extends from a portion of the holder 35. The magnet 362 is attached to an end of the arm 361. The detecting unit 363 is supported by a portion of the frame 302, and includes hall elements for detecting a change in the magnetic force of the magnet 362 due to the positional change of the holder 35 (the CCD 31). According to an instruction from the Bucom 50, the vibration control circuit 355 controls the vibrator drive circuit 354 for the X-axis vibrator 320x and the Y-axis vibrator 320y based on a signal from the X-axis gyroscope 350x, the Y-axis gyroscope 350y, and the position sensor 360.

The operation of the X-axis drive mechanism 310x is described below. As described above, the X-axis vibrator 320x causes elliptical vibration in the drivers 321x and 322x when applied with a predetermined frequency voltage. As a result, since the drivers 321x and 322x are in pressure contact with the slide plate 332x by a strong biasing force of the pressing mechanism 340x, the slide member 330x is driven in the direction of the elliptical vibration of the drivers 321x and 322x.

The operation of the X-axis vibrator 320x to move the slide member 330x is described below with reference to FIG. 9. FIG. 9 is a schematic diagram illustrating the driving principle of the X-axis vibrator 320x in chronological order. In FIG. 9, the scale of amplitude in the vibration direction is increased by a factor of around 50 to 100. The following describes as an example the operation of causing clockwise elliptical vibration in the drivers 321x and 322x, where Pi represents a contact point of the driver 321x with respect to the slide member 330x (the central point on the lower side of the driver 321x) and Qi represents a contact point of the driver 322x with respect to the slide member 330x (the central point on the lower side of the driver 322x).

In state (a) of FIG. 9, while contact point Pa on which a force of the driver 321x acts leftward is in contact with the slide member 330x, contact point Qa on which a force of the driver 322x acts rightward is separate therefrom. Thus, a driving force acts to move the slide member 330x leftward at contact point Pa. In state (b) of FIG. 9, both contact point Pb on which a force of the driver 321x acts upward and contact point Qb on which a force of the driver 322x acts downward are in contact with the slide member 330x. Thus, the piezoelectric element 323x exerts no driving force on the slide member 330x.

Subsequently, as indicated by states (c) to (e) of FIG. 9, contact points Qc to Qe on which a force of the driver 322x acts leftward are brought into contact with the slide member 330x as the driving force varies according to the elliptical vibration of the piezoelectric element 323x. On the other hand, contact points Pc to Pe on which a force of the driver 321x acts rightward are separate from the slide member 330x. Thus, a driving force acts to move the slide member 330x leftward. Then, in state (f) of FIG. 9, the piezoelectric element 323x exerts no driving force on the slide member 330x. After that, as indicated by states (g) and (h) of FIG. 9, contact points Pg and Ph on which a force of the driver 321x acts leftward are brought into contact with the slide member 330x as the driving force varies according to the elliptical vibration of the piezoelectric element 323x. On the other hand, contact points Qg and Qh on which a force of the driver 322x acts rightward are separate from the slide member 330x. Thus, a driving force acts to move the slide member 330x leftward.

In this manner, states (a) to (h) of FIG. 9 are repeated to move the slide member 330x leftward. In the case of counterclockwise elliptical vibration, the slide member 330x can be moved rightward. That is, the X-axis vibrator 320x sequentially changes in shape so that the two drivers 321x and 322x are alternately brought into contact with the slide member 330x, thereby driving and moving the slide member 330x in a desired direction.

In relation to the operating principle of the X-axis drive mechanism 310x as described above, a positional relation between the balls 337x and 338x and the drivers 321x and 322x are explained below with reference to FIGS. 10 and 11. In FIGS. 10 and 11, the scale of amplitude in the vibration direction is also increased by a factor of around 50 to 100. First, a case is described where, as shown in FIG. 11A, a spacing between the two balls 337x and 338x is smaller than that between the two drivers 321x and 322x. In FIGS. 11B and 11C, in this case, dashed lines indicate that only the driver 322x need be in contact with the slide member 330x so that a driving force acts through the driver 322x, and that only the driver 321x need be in contact with the slide member 330x so that a driving force acts through the driver 321x, respectively.

In the state shown in FIG. 11B, contact point Q of the driver 322x in contact with the slide member 330x is located more outward than the ball 338x. In this state, the piezoelectric element 323x is pressed by the pressing mechanism 340x with a high pressure. Thus, the slide member 330x, which is supposed to be always in contact with the balls 337x and 338x to be supported by them, tilts about the ball 338x as a fulcrum as indicated by dashed lines. As a result, the tilted slide member 330x is brought into contact with the driver 321x. At this point, since a driving force due to the elliptical vibration acts in a direction opposite to the desired one on the contact point of the driver 321x, the driving force (output) of the X-axis vibrator 320x decreases when the drivers 321x and 322x are both in contact with the slide member 330x at the same time. This occurs similarly in the state shown in FIG. 11C. In addition, the repetition of such a state causes vibration of a driving frequency shifted a little (for example, 1 kHz) from the original one. This causes beat notes, and produces audible sounds.

Figure 10A:
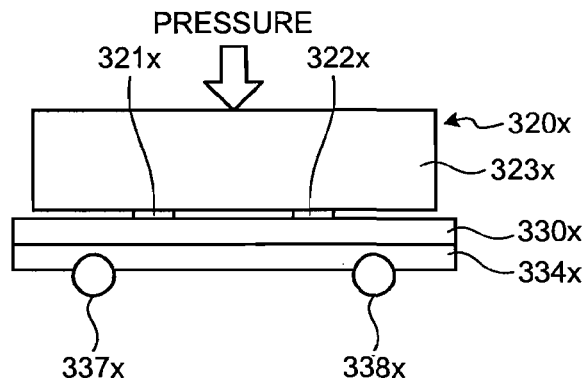
FIG. 10A is a schematic side view for explaining a positional relation between balls and drivers.
Figure 10B:
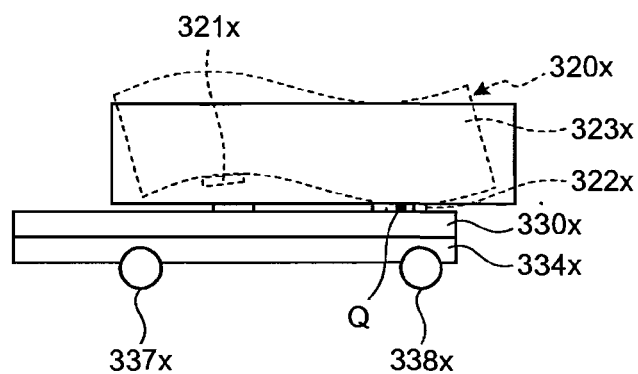
FIG. 10B is a schematic side view for explaining a positional relation between balls and drivers operating in a certain manner.
Figure 10C:
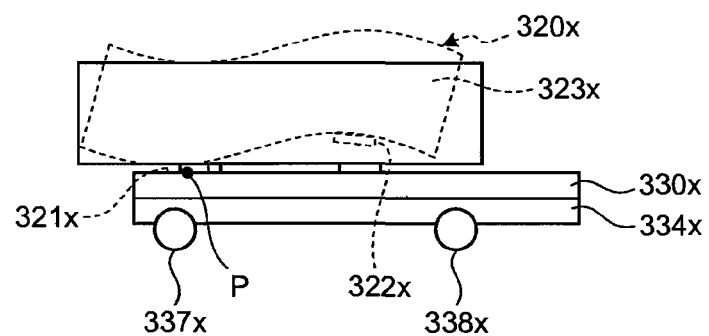
FIG. 10C is a schematic side view for explaining a positional relation between balls and drivers operating in another manner.
Figure 11A:
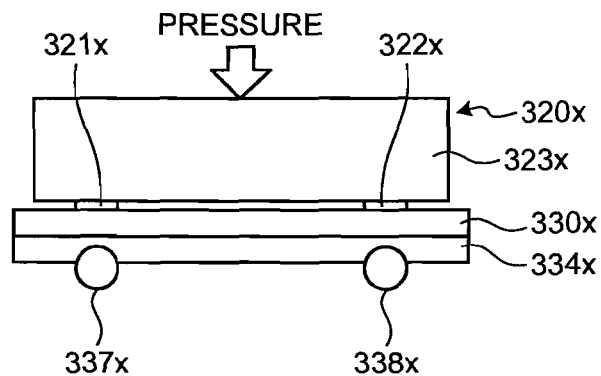
FIG. 11A is a schematic side view for explaining an unfavorable positional relation between balls and drivers.
Figure 11B:
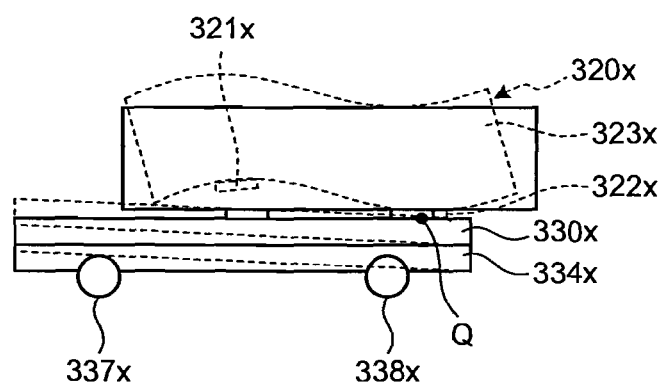
FIG. 11B is a schematic side view for explaining an unfavorable positional relation between balls and drivers operating in a certain manner.
Figure 11C:
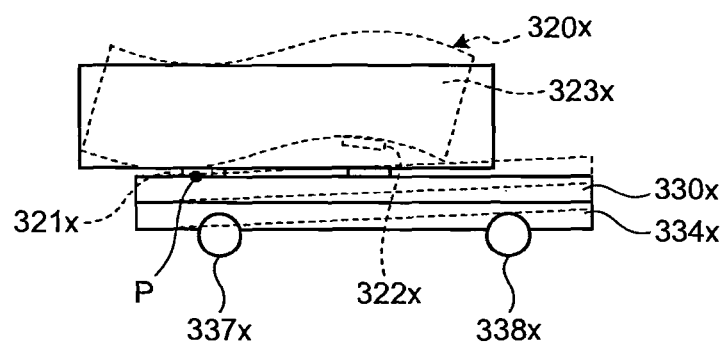
FIG. 11C is a schematic side view for explaining an unfavorable positional relation between balls and drivers operating in another manner.

Taking this point into consideration, according to this embodiment, a positional relation between the balls and the drivers is set such that, as shown in FIG. 10A, a spacing between the two balls 337x and 338x is larger than that between the two drivers 321x and 322x. In FIGS. 10B and 10C, in this case, dashed lines indicate that only the driver 322x is in contact with the slide member 330x so that a driving force acts through the driver 322x, and that only the driver 321x is in contact with the slide member 330x so that a driving force acts through the driver 321x, respectively.

In the state shown in FIG. 10B, contact point Q of the driver 322x in contact with the slide member 330x is located more inward than the ball 338x (between the balls 337x and 338x). Therefore, even if the piezoelectric element 323x is pressed by the pressing mechanism 340x with a high pressure, the slide member 330x does not tilt, and is always in contact with the balls 337x and 338x to be supported by them. This ensures that a driving force acts while the driver 321x is separate from the slide member 330x and only the driver 322x is in contact therewith. Thus, such an event does not occur that the drivers 321x and 322x are both in contact with the slide member 330x at the same time. Accordingly, the X-axis vibrator 320x provides stable output without a decrease in the driving force. The same applies to the state shown in FIG. 10C. In other words, when operating to move the slide member 330x, the drivers 321x and 322x are always located between the balls 337x and 338x. Besides, since the drivers 321x and 322x can be prevented from being in contact with the slide member 330x at the same time, such problems as causing beat notes and thus producing audible sounds do not arise.

From the point of view of the type of vibration of the X-axis vibrator 320x, the balls 337x and 338x are only required to be spaced apart greater than a distance between loops of the bending vibration of the X-axis vibrator 320x (see FIGS. 10B and 10C). Even when the slide member 330x moves to the full extent of its travel on the frame 302, the balls 337x and 338x and the drivers 321x and 322x need only to satisfy such a positional relation that the drivers 321x and 322x are located between the balls 337x and 338x in a direction parallel to the central axis of the piezoelectric element 323x. Preferably, the balls 337x and 338x are arranged near the edges of the slide member 330x, respectively, and separate from each other as far as possible.

Although the X-axis vibrator 320x is applied with high pressure, the drivers 321x and 322x are stably in pressure contact with the slide plate 332x because of the high hardness of the slide plate 332x and the bearing 331x. Accordingly, the driving force caused by the elliptical vibration is reliably transmitted to the slide plate 332x, and thus the slide member 330x can be efficiently driven in the direction of the elliptical vibration. Besides, the slide member 330x having the slide plate 332x is not in surface contact with the frame 302, but is in contact therewith via the rotating balls 337x and 338x at the bearings 331x and 304x. Therefore, even with high pressure, the slide member 330x reliably moves with low friction with respect to the frame 302. The bearings 331x and 304x have a ball bearing structure including balls placed in a row along the X-axis direction. Thus, when driven by the X-axis vibrator 320x, the slide member 330x moves only in the X-axis direction. With this, the X frame 301 having the slide member 330x fixed thereto also moves in the X-axis direction together with the slide member 330x. In other words, the moving direction of the X frame 301 is also guided by the engagement between the bearings 331x and 304x having a ball bearing structure in which balls are placed in a row along the X-axis direction.

In such a configuration, the bearing 331x is rotatable around an axis passing through the center of the balls 337x and 338x and in parallel with the V-shaped groove 334x. As described above, according to the embodiment, the bearing 331x is integrated with the X frame 301. Between the X frame 301 and the frame 302 is arranged the ball 307x in a position separate from the bearing 331x in a direction other than the X-axis direction. The first movable member 311x formed of the X frame 301 and the slide member 330x is supported with respect to the frame 302 based on three-point support by the balls 337x and 338x, and the ball 307x located separate from each other. As a result, the first movable member 311x stably moves on the frame 302 along the X-axis direction without being affected by the rotation around the axis in parallel with the V-shaped groove 334x. Therefore, a guide support mechanism for a portion where the X-axis vibrator 320x is applied with high pressure is only required to have the ball bearing structure of the bearings 331x and 304x that includes balls placed in a row along the X-axis direction. Thus, it is possible to downsize the electronic camera as well as to simplify the configuration of the camera.

It should be noted that the Y-axis drive mechanism 310y operates basically in the same manner as the X-axis drive mechanism 310x.

It is to be understood that the present invention is not limited to the above embodiment, and is susceptible to numerous changes and modifications. For example, while, in the embodiment described above, two rotating members are described as the balls 337x and 338x (337y and 338y), they can be cylindrical rollers. In this case, the rollers are arranged such that the central axis is perpendicular to the X-axis (Y-axis) direction in the X-Y plane. By using a guide member in a shape of cross-section concave that guides the movement of the rollers in the X-axis (Y-axis) direction, the moving direction of the movable member 311x (311y) can be guided and the inclination thereof can be regulated. This eliminates the necessity of the use of the ball 307x (307y).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A drive device comprising:
    an actuator that includes a piezoelectric element having as a whole an elongated shape and at least two drivers that are arranged on the piezoelectric element along an axis parallel to a central axis of the piezoelectric element;
    a fixed member on which the actuator is arranged;
    a movable member that moves by the drivers on the fixed member;
    two rotating members that are located between the fixed member and the movable member to support the movable member that moves on the fixed member; and
    a guide member that is arranged on at least one of the fixed member and the movable member, and guides movement of the rotating members in a direction parallel to the central axis of the piezoelectric element, wherein
    a positional relation between the drivers and the rotating members is defined such that the drivers are located between the rotating members in the direction parallel to the central axis of the piezoelectric element even when the movable member moves to a maximum extent on the fixed member.

2. The drive device according to claim 1, wherein the rotating members are arranged near edges of the movable member, respectively, and separate from each other.

3. An image stabilizer for correcting a position on a surface of the imaging device where light rays reflected from an object are focused, the image stabilizer comprising:
    a first actuator that includes a piezoelectric element having as a whole an elongated shape and at least two first drivers that are arranged on the piezoelectric element along an axis parallel to a central axis of the piezoelectric element, the first actuator being arranged in parallel with a direction of a first side of the imaging device;
    a fixed member that includes the first actuator;
    a second actuator that includes a piezoelectric element having as a whole an elongated shape and at least two second drivers that are arranged on the piezoelectric element along an axis parallel to a central axis of the piezoelectric element, the second actuator being arranged in parallel with a direction of a second side of the imaging device perpendicular to the first side;

a first movable member that includes the second actuator, and moves, when driven by the first actuator, in the direction of the first side on the fixed member;

a second movable member that is mounted with the imaging device, and moves, when driven by the second actuator, in the direction of the second side on the first movable member;

two first rotating members that are located between the fixed member and the first movable member to support the first movable member that moves on the fixed member; and two second rotating members that are located between the first movable member and the second movable member to support the second movable member that moves on the first movable member, wherein the first drivers are located between the first rotating members during operation to move the first movable member, and the second drivers are located between the second rotating members during operation to move the second movable member.

4. A drive device comprising:

a vibrator that, when applied with a predetermined frequency voltage, causes elliptical vibration having a different phase in each of two driving members;

a fixed member that includes a holding member for holding the vibrator;

a pressing mechanism that presses the driving members of the vibrator arranged on the fixed member; and a movable member that is driven by the elliptical vibration of the vibrator, moving direction of which is regulated by a guide member of the fixed member, the driving members being in pressure contact with the movable member, wherein the guide member includes
   two first rotating members that are arranged separate from each other;
   a first groove that is provided on the fixed member; and
   a second groove that is provided on the movable member such that the first rotating members are fitted in between the first groove and the second groove, and
a spacing between the first rotating members is larger than a spacing between the driving members.

5. The drive device according to claim 4 further comprising a second rotating member between the fixed member and the movable member in a position separate from the guide member in a direction other than the moving direction of the movable member.

6. The drive device according to claim 5 further comprising a biasing member that is engaged between the fixed member and the movable member, wherein the second rotating member is held between the fixed member and the movable member by a biasing force of the biasing member, and the biasing force of the biasing member is set to be smaller than a biasing force of the pressing mechanism.

7. A drive device comprising:

a vibrator that, when applied with a predetermined frequency voltage, causes a combination of longitudinal vibration and bending vibration as elliptical vibration having a different phase in each of two driving members;

a fixed member that includes a holding member for holding the vibrator;

a pressing mechanism that presses the driving members of the vibrator arranged on the fixed member; and a movable member that is driven by the elliptical vibration of the vibrator, moving direction of which is regulated by a guide member of the fixed member, the driving members being in pressure contact with the movable member, wherein the guide member includes
   two first rotating members that are arranged separate from each other;
   a first groove that is provided on the fixed member; and
   a second groove that is provided on the movable member such that the first rotating members are fitted in between the first groove and the second groove, and
the first rotating members are spaced apart greater than a distance between loops of the bending vibration.

8. The drive device according to claim 7 further comprising a second rotating member between the fixed member and the movable member in a position separate from the guide member in a direction other than the moving direction of the movable member, wherein the first rotating members and the second rotating member are balls.

9. The drive device according to claim 8 further comprising a biasing member that is engaged between the fixed member and the movable member, wherein the second rotating member is held between the fixed member and the movable member by a biasing force of the biasing member, and the biasing force of the biasing member is set to be smaller than a biasing force of the pressing mechanism.

* * * * *